United States Patent [19]

Takemae et al.

[11] Patent Number: 4,572,977
[45] Date of Patent: Feb. 25, 1986

[54] RANGE CHECKING COMPARATOR

[75] Inventors: Yoshihiro Takemae, Tokyo; Yasuo Suzuki, Yokohama, both of Japan

[73] Assignee: Fujitsu Limited, Kawasaki, Japan

[21] Appl. No.: 560,953

[22] Filed: Dec. 13, 1983

[30] Foreign Application Priority Data

Dec. 24, 1982 [JP] Japan ................. 57-225825

[51] Int. Cl.[4] ............ H03K 5/24; G01R 19/165; G11C 7/06
[52] U.S. Cl. .................. 307/530; 307/474; 307/360; 365/205
[58] Field of Search ........... 307/530, 356, 360–362, 307/474; 365/103, 104, 189, 205, 207, 208

[56] References Cited

U.S. PATENT DOCUMENTS

| 4,255,678 | 3/1981 | Suzuki et al. | 365/205 X |
| 4,327,424 | 4/1982 | Wu | 365/104 |
| 4,358,690 | 11/1982 | Ollendick | 307/359 |
| 4,366,559 | 12/1982 | Misaizu et al. | 365/205 |
| 4,412,143 | 10/1983 | Patella et al. | 365/205 X |
| 4,413,330 | 11/1983 | Chao | 365/205 |
| 4,443,868 | 4/1984 | Takemae | 365/205 |
| 4,445,203 | 4/1984 | Iwahashi | 365/205 X |

FOREIGN PATENT DOCUMENTS 2084828 4/1982 Japan .

OTHER PUBLICATIONS

Patent Abstracts of Japan, vol. 4, No. 170, Nov. 22, 1980 & JP-A-55-134535.
Patent Abstracts of Japan, vol. 5, No. 3, Jan. 10, 1981 & JP-A-55-134535.
Electronics, vol. 53, No. 22, Oct. 9, 1980, New York, J. G. Posa "Four-State Cell Doubles ROM Bit Capacity", p. 39.
European Search Report, Appl. No. EP 83 40 2388, Berlin, Compl. Date 3/16/84, Examiner, Arendt, M.

Primary Examiner—Larry N. Anagnos
Attorney, Agent, or Firm—Staas & Halsey

[57] ABSTRACT

A comparator includes a first terminal, a second terminal, a first flip-flop circuit which inverts when the voltage applied to the first terminal becomes larger by $\Delta V_1$ than the voltage applied to the second terminal, a third terminal, a fourth terminal, and a second flip-flop circuit which inverts when the voltage applied to the third terminal becomes smaller by $\Delta V_2$ than the voltage applied to the fourth terminal. The comparator further includes a first switching circuit and a second switching circuit which, respectively, connect the first terminal and the fourth terminal to a voltage source to be compared, a third switching circuit and a fourth switching circuit which connect the second terminal and the third terminal to a reference voltage source. Also included is a fifth switching circuit which is commonly connected to the first flip-flop circuit and the second flip-flop circuit.

6 Claims, 11 Drawing Figures

RANGE CHECKING COMPARATOR

BACKGROUND OF THE INVENTION

1. Field of the Invention

The present invention relates to a comparator by which it can be determined whether a certain voltage is in a predetermined range with respect to a reference voltage.

3. Description of the Prior Art

For the purpose of increasing the integration density, mask read-only memory cells having multi-values, for example, four values, recently have frequently been used. In the case of a cell having four values, the four values correspond to the voltage width or range of the transistor, and the mid value of the width is used as the value of the reference cell. The value of the reference cell is read out, and the readout value is coded into binary information. In such a cell having four values, the deviation of the width of the transistor of the reference cell should be small because the width of the transistor is originally small. Therefore, detection of the value of the reference cell becomes very difficult because the flip-flop circuit which is conventionally used cannot be used to detect this value.

A single flip-flop circuit can be used to determine whether or not an input voltage is larger or smaller than the reference voltage. However, a flip-flop circuit cannot be used to determine whether or not the input voltage is in the predetermined range with respect to the reference voltage or in which direction the input voltage is shifted from the predetermined range. In such a case, a window comparator comprising two comparators is used. However, a window comparator requires two reference voltages and the circuit of the window comparator is complicated, thereby rendering the comparator unsuitable for forming an integrated circuit.

SUMMARY OF THE INVENTION

An object of the present invention is to form a comparator by which it can be determined whether a certain voltage is in a predetermined range with respect to a reference voltage.

Another object of the present invention is to provide a comparator which can be used to suitably determine the multi-values of a read-only memory cell.

According to the present invention, this object can be achieved with a comparator including a first terminal, a second terminal, a first flip-flop circuit which inverts when the voltage applied to the first terminal becomes larger by $\Delta V_1$ than the voltage applied to the second terminal. Also included are a third terminal, a fourth terminal, a second flip-flop circuit which inverts when the voltage applied to the third terminal becomes smaller by $\Delta V_2$ than the voltage applied to the fourth terminal, a first switching circuit and a second switching circuit which, respectively, connect the first terminal and the third terminal to voltage sources to be compared, a third switching circuit and a fourth switching circuit which, respectively, connect the second terminal and the fourth terminal to a reference voltage source. Further included is a fifth switching circuit which is commonly connected to the first flip-flop circuit and the second flip-flop circuit so that the result of the comparison is output from the first terminal and the third terminal or the second terminal and the fourth terminal.

Further, features and advantages of the present invention will be apparent from the ensuing description, with reference to the accompanying drawings, to which, however, the scope of the invention is in no way limited.

DESCRIPTION OF THE PREFERRED EMBODIMENTS

Figure 1:
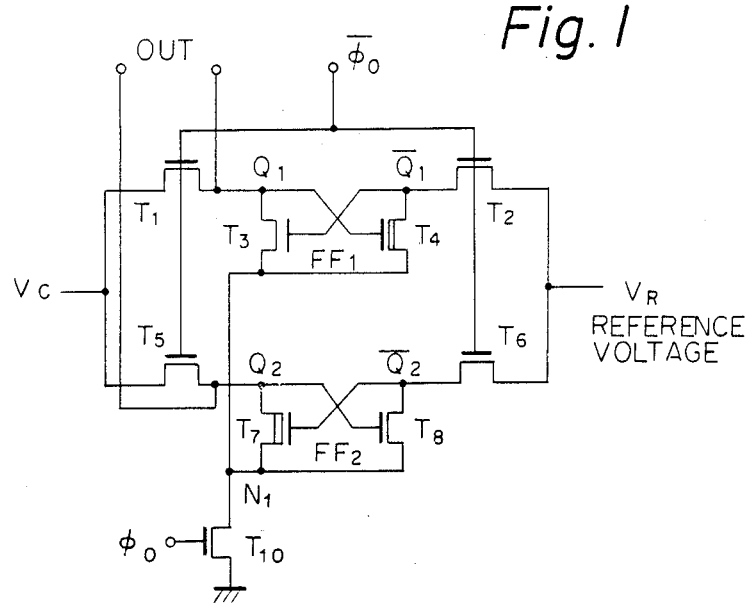
FIG. 1 is a circuit diagram of one embodiment of the comparator according to the present invention.

FIG. 1 illustrates one embodiment of the present invention, and FIGS. 2A to 2D are diagrams illustrating the function of the present invention.

In FIG. 1, the transistors $T_1$, $T_2$, $T_5$ and $T_6$ are controlled by a phase clock pulse $\phi_0$ and are turned on after the nodes $Q_1$, $\overline{Q}_1$, $Q_2$ and $\overline{Q}_2$ are precharged to the voltage $V_C$ and the reference voltage $V_R$, respectively, to separate the input side and the reference voltage side from the comparator. The transistors $T_3$ and $T_4$ form a first flip-flop circuit $FF_1$, and the transistors $T_7$ and $T_8$ form a second flip-flop circuit $FF_2$. In the transistors $T_3$, $T_4$ and $T_7$, $T_8$, a difference of several hundred millivolts ($\Delta V_{th}$) in the threshold values $V_{th}$ is created. That is, the threshold value $V_{th}$ of the transistors $T_4$ and $T_7$ is set several hundred millivolts higher than that of the transistors $T_3$ and $T_8$. In such a construction, when the voltage $V_C$ is in the range of several hundred millivolts with respect to the reference voltage $V_R$, the nodes $Q_1$ and $Q_2$ (or $\overline{Q}_1$ and $\overline{Q}_2$) of the first flip-flop $FF_1$ and of the second flip-flop $FF_2$ have reverse relationships. When the voltage $V_C$ is several millivolts higher than the voltage $V_R$, the nodes $Q_1$ and $Q_2$ both become a high level, and when the voltage $V_C$ is several millivolts lower than the voltage $V_R$, the nodes $Q_1$ and $Q_2$ both become a low level. That is, when $\overline{\phi}_0$ is placed at a high level and $\phi_0$ is placed at a low level, the nodes $Q_1$, $\overline{Q}_1$, $Q_2$ and $\overline{Q}_2$ are precharged. When $\overline{\phi}_0$ is placed at a low level and $\phi_0$ is placed at a high level, the transistors $T_1$, $T_2$, $T_5$ and $T_6$ are placed in an off state, the transistor $T_{10}$ is placed in an on state, and the flip-flops $FF_1$ and $FF_2$ are activated so that the comparator operation is commenced.

Figure 2A:
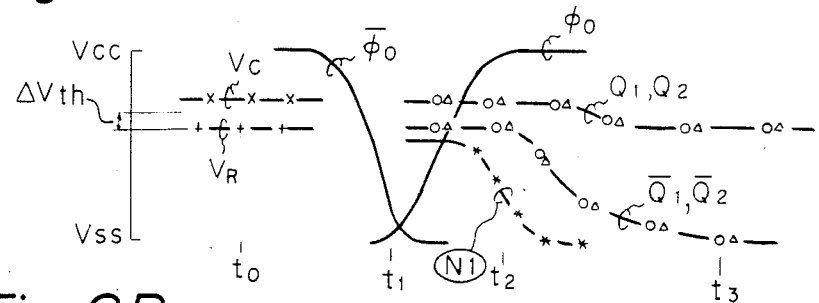
FIGS. 2A to 2D are waveform diagrams illustrating the operation of the comparator shown in FIG. 1.

This operation is shown in FIGS. 2A, 2B, 2C, and 2D. FIG. 2A illustrates the case when the voltage $V_C$ is $V_C > V_R + \Delta V_{th}$. In this case, the transistor $T_4$ turns on and the transistor $T_3$ turns off so that the node $Q_1$ becomes a high level and the node $\overline{Q}_1$ becomes a low level. Further, the transistor $T_8$ turns on and the transistor $T_7$ turns off so that the node $Q_2$ becomes a high level and the node $\overline{Q}_2$ becomes a low level.

Figure 2B:
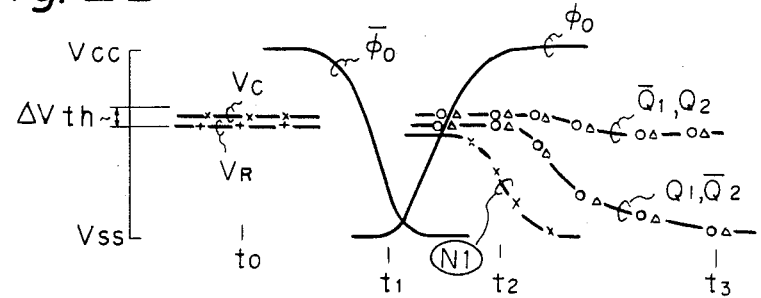
Figure 2C:
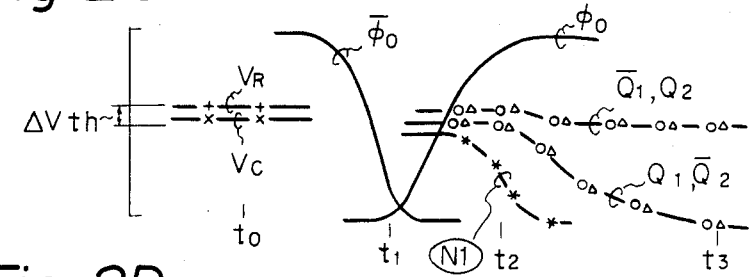

FIG. 2B illustrates the case when $V_R + V_{th} > V_C > V_R$. In this case, the transistor $T_3$ turns on, the transistor $T_4$ turns off, the transistor $T_7$ turns off, and the transistor $T_8$ turns on so that the nodes $Q_1$ and $\overline{Q}_2$ become a low level and the nodes $\overline{Q}_1$ and $Q_2$ become a high level. FIG. 2C illustrates the case when $V_R > V_C >$.

Figure 2D:
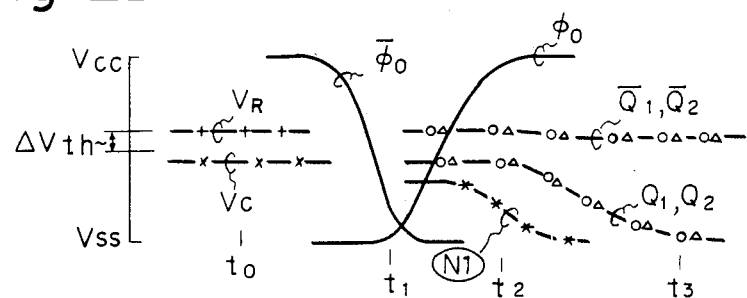

$V_R - \Delta V_{th}$ in which the nodes $Q_1$ and $\overline{Q}_2$ become a low level and the nodes $Q_2$ and $\overline{Q}_1$ become a high level. FIG. 2D illustrates the case when $V_R - \Delta V_{th} > V_C$. In this case, the nodes $\overline{Q}_1$ and $\overline{Q}_2$ become a high level and the nodes $Q_2$ and $Q_1$ become a low level. The cases shown in FIGS. 2A, 2B, 2C, and 2D are shown in the Table.

TABLE

|  |  | NODES | |
| --- | --- | --- | --- |
|  |  | $Q_1$ | $Q_2$ |
| $V_C > V_R + \Delta V_{th}$ | FIG. 2A | "H" | "H" |
| $V_R + \Delta V_{th} > V_C$ | FIG. 2B | "L" | "H" |
| $> V_R - \Delta V_{th}$ | FIG. 2C |  |  |
| $V_R - \Delta V_{th} > V_C$ | FIG. 2D | "L" | "L" |

As is shown in the Table, when the voltage $V_C$ is in the range of several hundred millivolts with respect to the reference voltage $V_R$, the node $Q_1$ becomes a low level but the node $Q_2$ becomes a high level. Therefore, if the levels of the nodes $Q_1$ and $Q_2$ (or $\overline{Q}_1$ and $\overline{Q}_2$) are monitored, whether the voltage $V_C$ is in the range of several hundred millivolts with respect to the reference voltage $V_R$ or is higher or lower than this range can be determined. This range can be freely set by changing the difference $\Delta V_{th}$ between the transistors $T_3$ and $T_4$ and the transistors $T_7$ and $T_8$. Further, the difference $\Delta V_{th}$ can be easily changed by changing the threshold value of the transistors during ion implantation.

Figure 3:
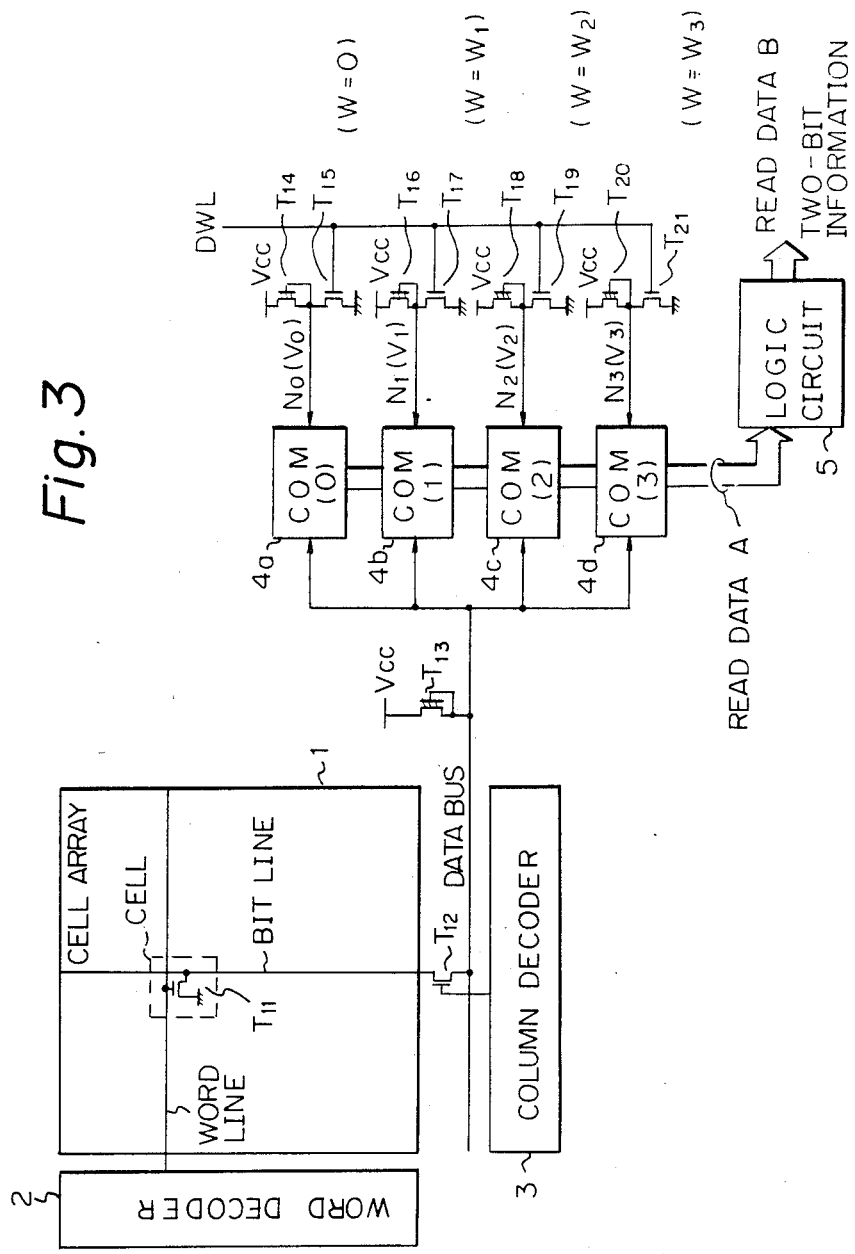
FIG. 3 is a block diagram illustrating how the present invention is used for determining the four values of the read-only memory cell.

FIG. 3 illustrates the application of the comparator shown in FIG. 1. In FIG. 3, a cell array 1 includes a transistor $T_{11}$, having four values, positioned close to a word line and a bit line. The word line and the bit line are selected by a word decoder 2 and a column decoder 3. The selected value of the transistor $T_{11}$ is supplied via a transistor $T_{12}$ to a transistor $T_{13}$ which is used as a level generator which outputs four levels. The output of the transistor $T_{13}$ is supplied to comparators 4a, 4b, 4c and 4d which correspond to the comparator shown in FIG. 1. The transistors $T_{14}$, $T_{15}$, $T_{16}$, $T_{17}$, $T_{18}$, $T_{19}$, $T_{20}$ and $T_{21}$ are used for supplying four reference voltages to the comparators 4a, 4b, 4c and 4d. The transistors $T_{15}$, $T_{17}$, $T_{19}$ and $T_{21}$ are used as dummy cells, and the width of the transistors corresponds to the four values of the transistors in the read-only memory cell. The data of only one of the comparators 4a to 4d which corresponds to the output of the transistor $T_{13}$ is output as read data A, and this read data is converted to two-bit information in a logic circuit 5.

Figure 4:
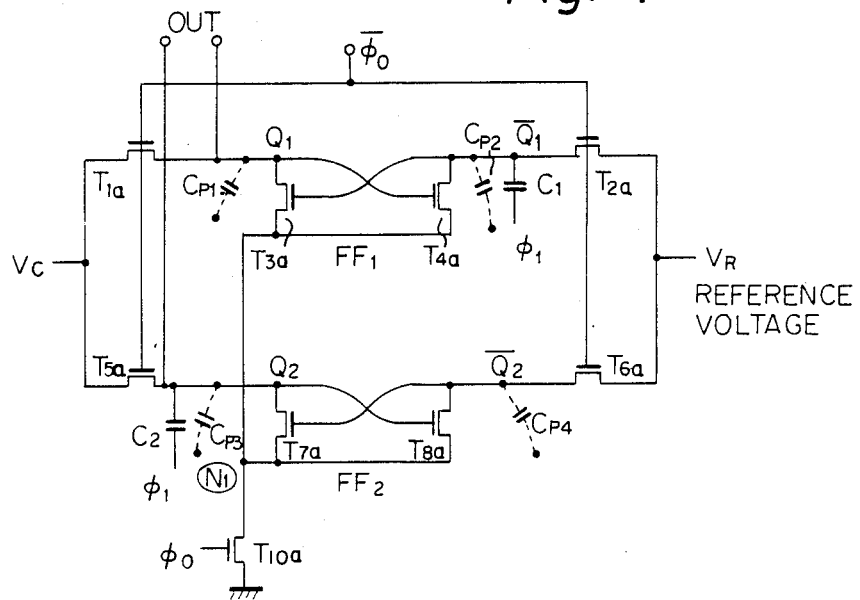
FIG. 4 is a circuit diagram of another embodiment of the comparator according to the present invention.

FIG. 4 is a circuit diagram of another embodiment of the present invention. In the embodiment of FIG. 4, the transistors $T_{3a}$ and $T_{4a}$ and the transistors $T_{7a}$ and $T_{8a}$ have the same threshold voltage $V_{th}$, and a difference of voltage $\Delta V$ is created between the transistors $T_{3a}$ and $T_{4a}$ and between the transistors $T_{7a}$ and $T_{8a}$. In FIG. 4, $C_{P1}$, $C_{P2}$, $C_{P3}$ and $C_{P4}$ are stray capacitances in the nodes $Q_1$, $\overline{Q}_1$, $Q_2$ and $\overline{Q}_2$, respectively, and the value of the stray capacitances is substantially the same because the layout of the flip-flop circuit is usually symmetrical. Therefore, as is shown in FIG. 4, one terminal of the capacitors $C_1$ and $C_2$ is connected to the collectors of the transistor $T_{4a}$ and the transistor $T_{7a}$ and another terminal of the capacitors $C_1$ and $C_2$ receives the phase clock pulse input $\phi_1$.

In the circuit shown in FIG. 4, at first, the phase clock pulse $\phi_0$ is placed at $V_{SS}$, the phase clock pulse $\phi_1$ is changed from $V_{SS}$ to $V_{CC}$, and the nodes $\overline{Q}_1$ and $Q_2$ are placed at a high potential level. Thus, a difference potential $\Delta V$ is created between $Q_1$ and $\overline{Q}_1$ and $Q_2$ and $\overline{Q}_2$. This is the same effect as the difference threshold levels in the transistors shown in FIG. 1. Next, the phase clock pulse $\phi_0$ is applied so as to operate the flip-flop circuits $FF_1$ and $FF_2$. The raised voltage $\Delta V$ is given as the value $$\Delta V = V_{CC} \times \frac{C_1}{C_{P2} + C_1}$$

and the value of the capacitance $C_1$ can be suitably selected for the purpose of determining the value of $\Delta V$.

Figure 5A:
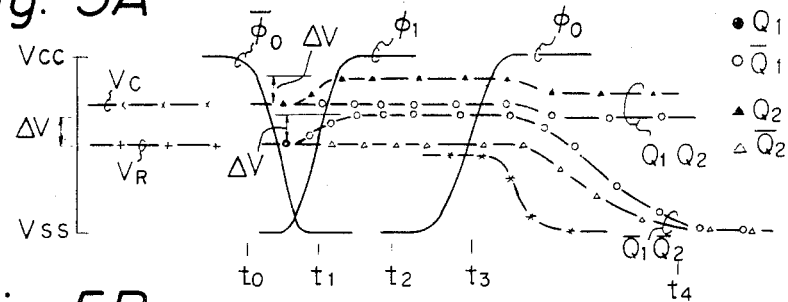
FIGS. 5A to 5D are waveform diagrams illustrating the operation of the comparator shown in FIG. 4.
Figure 5B:
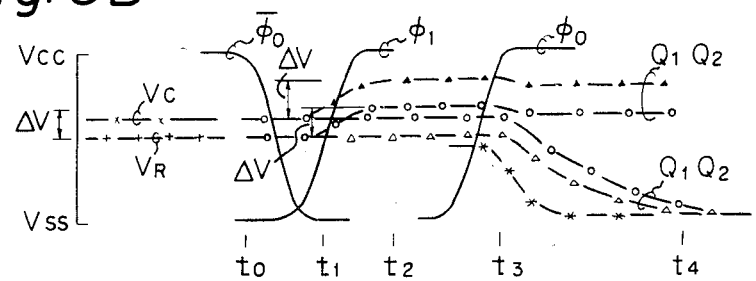

Timing charts showing the operation of the circuit shown in FIG. 4 are shown in FIGS. 5A, 5B, 5C and 5D. FIG. 5A shows the case when $V_C > V_R + \Delta V$. At the time $t_0$, the value of $\phi_0$ is placed at $V_{SS}$, and the potentials of $V_C$ and $V_R$ are stored in the nodes $Q_1$ and $\overline{Q}_1$ and the modes $Q_2$ and $\overline{Q}_2$. Next, the phase clock pulse $\phi_1$ is changed from $V_{SS}$ to $V_{CC}$, and the potentials of the nodes $\overline{Q}_1$ and $Q_2$ are raised to the value of $\Delta V$. Therefore, at the time $t_2$, as originally $V_C > V_R + \Delta V$, even if the potential of $\overline{Q}_1$ is raised to $\Delta V$, $VQ_1 > V\overline{Q}_1$. On the other hand, as the potential of $Q_2$ is raised to $\Delta V$, $VQ_2 > V\overline{Q}_2$. Next, the flip-flop circuits $FF_1$ and $FF_2$ are operated at the time $t_3$. FIG. 5B shows the case when $V_R + \Delta V > V_C > V_R$.

Figure 5C:
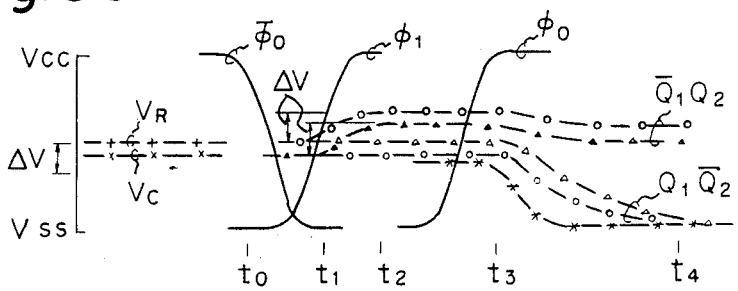

In this case, at the time $t_2$, the potential of the node $\overline{Q}_1$ is raised to $\Delta V$. Therefore, the values of the potentials of $Q_1$ and $\overline{Q}_1$ are inverted so that they become $V\overline{Q}_1 > VQ_1$. However, the values of the potentials of $Q_2$ and $\overline{Q}_2$ remain $VQ_2 > V\overline{Q}_2$. FIG. 5C shows the case when $V_R > V_C > V_R - \Delta V$.

Figure 5D:
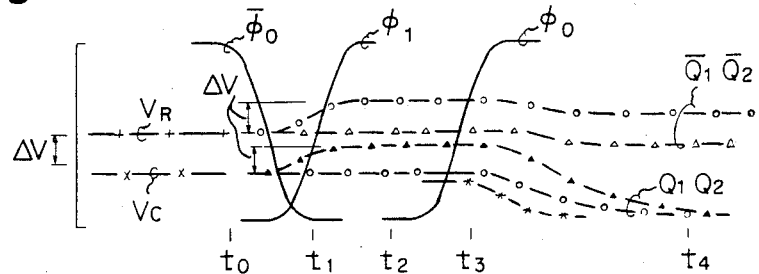

In this case, at the time $t_2$, the values of the potentials of $Q_1$ and $\overline{Q}_1$ remain $V\overline{Q}_1 > VQ_1$. However, the potential of the node $Q_2$ is raised to $\Delta V$ by the phase clock pulse $\phi_1$, and the relationship of the potentials of $Q_2$ and $\overline{Q}_2$ is inverted from $V\overline{Q}_2 > VQ_2$ to $VQ_2 > V\overline{Q}_2$. FIG. 5D shows the case when $V_C < V_R - \Delta V$. In this case, if the potentials of the nodes $\overline{Q}_1$ and $Q_2$ are raised, at the time $t_2$, the relationships $V\overline{Q}_1 > VQ_1$ and $V\overline{Q}_2 > VQ_2$ do not change.

As is explained in detail above, in accordance with the present invention, whether or not the stored value is in the range of several hundred millivolts with respect to the reference voltage or is higher or lower than this range can be precisely determined by using this simple circuit. Further, this range can be freely set by changing the threshold voltages of the transistors used in the flip-flop circuit. Further, in the present invention, asymmetrical operation of the flip-flop due to the difference of the transistors used in the flip-flop is used. However, it should be understood that many methods can be used to make the operation of the flip-flop asymmetrical, in addition to the method in which a difference in the threshold values of the transistors is created.

We claim:

1. A comparator, comprising:
   a first flip-flop circuit having first and second terminals, said first flip-flop circuit changing from a first state to a second state when a voltage applied to said first terminal is larger by a first amount than a voltage applied to said second terminal;
   a second flip-flop circuit having third and fourth terminals, said second flip-flop circuit changing from the first state to the second state when a voltage applied to said third terminal is smaller by a second amount than a voltage applied to said fourth terminal;

first and second switching circuits which, respectively, connect said first terminal and said third terminal to a common voltage source to be compared;

third and fourth switching circuits which, respectively, connect said second terminal and said fourth terminal to a common reference voltage source; and a fifth switching circuit, commonly connected to said first flip-flop circuit and said second flip-flop circuit, for activating said first and second flip-flop circuits.

2. A comparator according to claim 1,
wherein said first flip-flop circuit comprises:
   a first transistor having a gate connected to said second terminal; and
   a second transistor having a gate connected to said first terminal,
wherein said second flip-flop comprises:
   a third transistor having a gate connected to said fourth terminal; and
   a fourth transistor having a gate connected to said third terminal, and
wherein threshold values of said first transistor and said fourth transistor are set to be different threshold values than those of said second transistor and said third transistor.

3. A comparator according to claim 1,
wherein said first flip-flop circuit comprises:
   a first transistor having a gate connected to said second terminal; and
   a second transistor having a gate connected to said first terminal,
wherein said second flip-flop circuit comprises:
   a third transistor having a gate connected to said fourth terminal and a fourth transistor having a gate connected to said third terminal, and
said comparator further comprising:
   a first capacitor connected to said second terminal, and to receive a phase clock pulse; and
   a second capacitor connected to said third terminal and to receive said phase clock pulse.

4. A comparator, comprising:
a first flip-flop having first and second input terminals and a state which changes from a first state to a second state when a first voltage applied to the first terminal is larger than a common reference voltage applied to the second terminal;

a second flip-flop having third and fourth input terminals and a state which changes from the first state to the second state when a second voltage applied to a third terminal is smaller than the common reference voltage applied to said fourth terminal; and means, operatively connected to said first and second flip-flops, for applying the first and second voltages as a common input voltage to be compared to said first and second flip-flops and for applying the common reference voltage to said first and second flip-flops.

5. A comparator according to claim 4, further comprising activation means, operatively connected to said first and second flip-flops, for activating said first and second flip-flops.

6. A comparator according to claim 4, wherein the first and second voltages comprise a voltage range which is at least several hundred millivolts.

* * * * *

UNITED STATES PATENT AND TRADEMARK OFFICE
CERTIFICATE OF CORRECTION

PATENT NO. : 4,572,977
DATED : February 25, 1986
INVENTOR(S) : YOSHIHIRO TAKEMAE ET AL.

It is certified that error appears in the above-identified patent and that said Letters Patent is hereby corrected as shown below:

Col. 2, line 25, "$\emptyset_0$" should be --$\overline{\emptyset}_0$--.

Col. 3, line 1, "$\Delta Vth$" should be --$\Delta V_{th}$--;

line 3, "$\Delta Vth$" should be --$\Delta V_{th}$--.

Col. 4, line 17, "modes" should be --nodes--;

"$Q_2$" should be --$\overline{Q}_2$--.

Signed and Sealed this

Tenth Day of June 1986

[SEAL]

Attest:

DONALD J. QUIGG

Attesting Officer

Commissioner of Patents and Trademarks